United States Patent [19]

Hiltpold et al.

[11] Patent Number: 4,963,769

[45] Date of Patent: Oct. 16, 1990

[54] CIRCUIT FOR SELECTIVE POWER-DOWN OF UNUSED CIRCUITRY

[75] Inventors: W. Randolph Hiltpold; Shiva P. Gowni, both of Starkville, Miss.

[73] Assignee: Cypress Semiconductor, San Jose, Calif.

[21] Appl. No.: 348,412

[22] Filed: May 8, 1989

[51] Int. Cl.$^5$ .................. H03K 19/173; H03K 19/094
[52] U.S. Cl. .................................. 307/465; 307/468; 307/296.3; 364/716; 365/227
[58] Field of Search ..................... 307/296.3, 465, 468, 307/530; 364/948.6, 716; 365/227, 226

[56] References Cited

U.S. PATENT DOCUMENTS

| | | | |
|---|---|---|---|
| 3,750,116 | 7/1973 | Kemerer | 365/227 |
| 4,124,899 | 4/1989 | Birkner et al. | 364/716 |
| 4,617,479 | 10/1986 | Hartmann et al. | 307/468 |
| 4,670,859 | 6/1987 | Furihata et al. | 365/227 |
| 4,774,421 | 9/1988 | Hartmann et al. | 364/716 |
| 4,783,606 | 11/1988 | Goetling | 307/468 |
| 4,851,720 | 7/1989 | Pathak et al. | 307/468 |
| 4,894,558 | 1/1990 | Conkle et al. | 364/716 |
| 4,906,870 | 3/1990 | Gongwer | 364/716 |

Primary Examiner—Stanley D. Miller
Assistant Examiner—Richard Roseen

Attorney, Agent, or Firm—Blakely, Sokoloff, Taylor & Zafman

[57] ABSTRACT

A power reduction circuit for selectively providing power to circuitry associated with and coupled to the power reduction circuit, which includes two transistors having current paths coupled in parallel and a nonvolatile programmable storage device having a current path coupled in series with the current paths of the two transistors. A control transistor which is also part of the power reduction circuit includes a current path between a power supply and the circuitry associated with and coupled to the power reduction circuit to selectively provide power to the associated circuitry. The control transistor has a control gate electrode which is coupled between the current path of the nonvolatile programmable storage device and the current paths of the two transistors. The state of the storage device controls the state of the control gate electrode of the control transistor and accordingly controls whether the power is supplied to the associated circuitry. The power reduction circuitry consumes essentially zero power during normal operation because either the programmable storage device or the two transistors coupled in series with the current path of this storage device are off, thereby drawing essentially zero power.

18 Claims, 1 Drawing Sheet

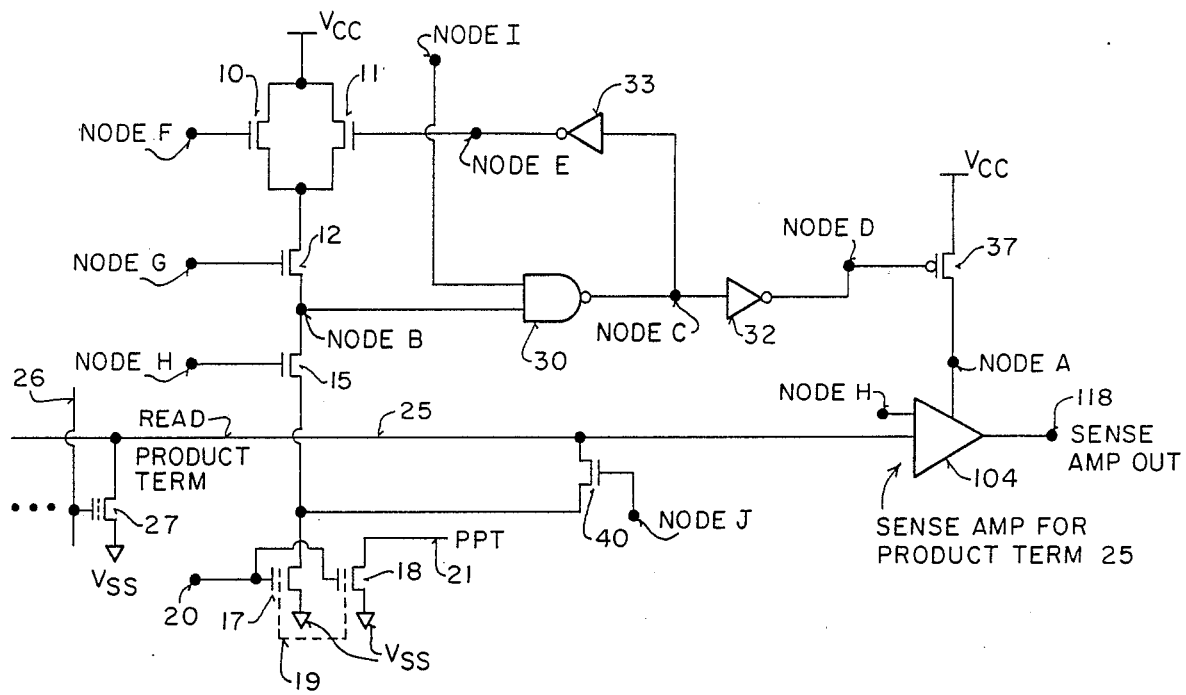
FIG_1
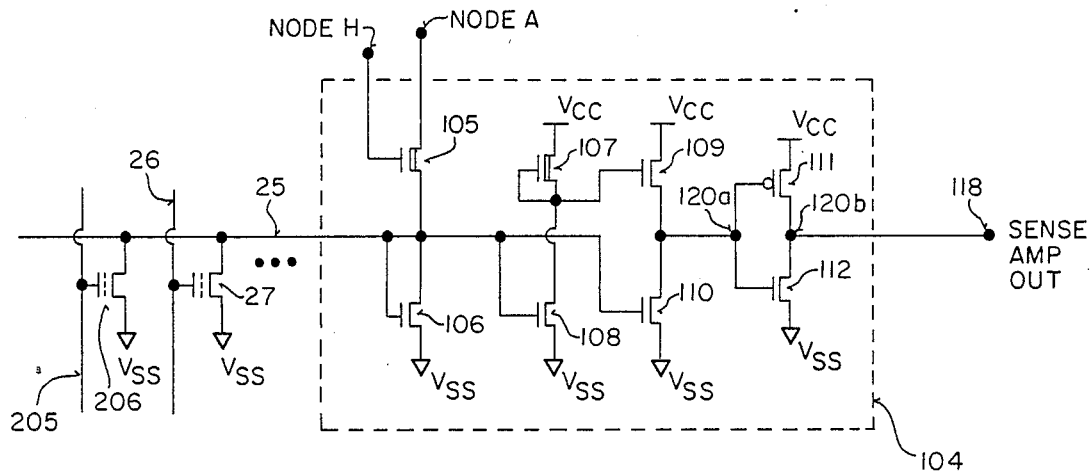
FIG_2
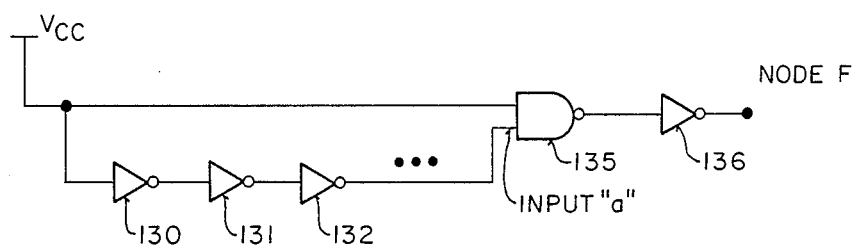
FIG_3

CIRCUIT FOR SELECTIVE POWER-DOWN OF UNUSED CIRCUITRY

BACKGROUND OF THE INVENTION

This invention relates to an essentially zero power circuit which reduces the power consumption of unused circuitry, particularly sense amplifier circuitry used for programmable logic devices (PLD). More specifically, this invention relates to a CMOS power reduction circuit for selectively powering down (i.e., reducing the power consumption of) a sense amplifier for an unused product term of a programmable logic array within a PLD.

Programmable logic devices having programmable logic arrays having input terms and product terms are well known in the art. Moreover, programmable logic arrays using EPROM (erasable, programmable, read only memory) storage cells are well known. The use of these storage cells at the "intersections" of the input terms and product terms allows the electrical programming of each cell. Moreover, these cells may typically be erased by exposing them to ultraviolet light thereby removing the charge from the floating gate which is sandwiched between control electrode of the EPROM device and the channel region of the device. The operation of these programmable logic devices using programmable logic arrays have been described in the literature and in patents. For example, U.S. Pat. Nos. 4,124,899; 4,609,986 and 4,617,479 and the references cited in those patents describe such arrays and the operation and construction thereof. This invention has application to various types of programmable logic arrays but is particularly suited to programmable logic arrays using a sum of products where the product of a plurality of input terms is taken on a particular product term which is then summed with other product terms.

As is well known in the art, these programmable logic devices, which utilize programmable logic arrays, allow a system designer to replace many LSI (large scale integration) gates with a single integrated circuit which is referred to as a programmable logic device (PLD). The nature of the PLD, a standard design to replace non-standard logic, requires that it be designed to handle the worst expected logic implementation. This constraint results in the majority of PLD devices being much less than 100% utilized. Consequently, for a particular PLD chip, many product terms are often unused and hence their sense amplifiers draw unnecessary power thereby increasing the overall power consumption of the PLD chip.

Certain attempts have been made in the prior art to reduce the power consumed by PLD's which are not fully utilized. An example of such an attempt is shown in U.S. Pat. No. 4,851,720, filed Sept. 2, 1988 (entitled: "Low Power Sense Amplifier for Programmable Logic Device") which is assigned to the assignee of the present invention. In that approach, power is reduced by clocking power to the sense amplifiers only when necessary to sense the state of the product terms. That is, power is provided to all sense amplifiers only during a certain period of time designed to coincide with the appearance of valid data on the product terms of the programmable logic devices described in that disclosure. This particular approach requires a synchronous (i.e., clocked) part; moreover, this approach consumes power because the circuits producing the clocking pulses consume power and because all sense amplifiers are turned on whether or not a product term is utilized.

It is an object of the present invention to provide a circuit for selectively disabling unused circuitry, particularly sense amplifiers for unused product terms, in order to reduce power consumption of the unused circuitry. Moreover, it is an object of the present invention to provide a circuit which selectively disables unused circuitry without itself consuming significant power; that is, the circuitry which reduces power is itself a miser at power consumption in both active and stand-by states. Moreover, it is an object of the present invention to provide a power reduction circuit which remembers whether or not the circuitry associated with that power reduction circuit will be provided with power or not provided with power. These and other aspects of the invention will be described below.

SUMMARY OF THE INVENTION

A power reduction circuit, preferably constructed using CMOS (complimentary metal oxide semiconductor) technology, is coupled to unused circuitry to selectively provide power to the unused circuitry. In the preferred embodiment, the unused circuitry is the sense amplifier for an unused product term in a programmable logic device. The power reduction circuit may be coupled to any other circuitry which may be unused in order to selectively provide (or not provide) power to that other circuitry. Typically, each product term will have a sense amplifier and each sense amplifier will include the power reduction circuit of the present invention thereby allowing each sense amplifier to be selectively and independently controlled for power consumption.

The power reduction circuit of the present invention includes a nonvolatile programmable storage means, such as, for example, a floating gate avalanche injection metal oxide semiconductor (MOS) field effect device, which is commonly referred to as a "EPROM" or a FAMOS device. Such a device, as is well known, is electrically programmable using well known techniques and is also erasable by exposing the device to ultraviolet light. The nonvolatile programmable storage means of the present invention is used to store the information indicating whether or not the sense amplifier associated with the power reduction circuitry is to be powered up or powered down (i.e., power will be provided or power will not be provided). The nonvolatile programmable storage means includes a current path between the source and drain terminals of the storage means.

The power reduction circuitry also includes a latch means which includes two MOS field effect transistors having current paths which are coupled in parallel between a reference supply voltage and one of the terminals of the nonvolatile programmable storage means. Thus, the current paths of the two MOS field effect transistors are coupled in series with the current path of the storage means. The control gate electrode of one of these transistors is coupled to receive a power-up signal which is momentarily pulsed when power is first supplied to the power reduction circuitry (and of course to the PLD chip). The other transistor of the latch means has a control gate electrode which is coupled to one of the terminals of the nonvolatile storage means.

The power reduction circuit of the present invention also includes a control transistor device which has a control gate electrode which is coupled to one of the terminals of the nonvolatile programmable storage means. The control transistor device also includes a current path formed between the source and drain terminals of the control transistor device. One of those terminals is coupled to a power supply reference voltage and the other terminal is coupled to the unused circuitry (e.g., the sense amplifier for an unused product term). The signal present on the control gate electrode of the controls transistor divice whether or not power is supplied to the unused circuitry through the control transistor device. The state of the signal on the control gate of the control transistor device is dependent upon the state of the floating gate of the nonvolatile programmable storage means.

Programming of the nonvolatile programmable storage means occurs using well known techniques for programming EPROMs. After the nonvolatile programmable storage means is programmed (or not programmed if so desired), then the circuit is ready for normal operation. During normal operation, the circuit operates as follows. Immediately after power is first supplied to the power reduction circuit (and hence the PLD chip) a short, single shot pulse is supplied to the control gate electrode of one of the two transistors in the latch means. This effectively "interrogates" the state of the nonvolatile programmable storage means. For example, if the storage means has been programmed (i.e., the floating gate has been charged in the preferred embodiment) then the control gate electrode of the control transistor device will be pulled to a high state in the preferred embodiment, as will the control gate electrode of the other transistor device in the latch means. Once the power-up pulse disappears, the signal on the control gate electrode of the control transistor device will remain high as the high signal on the control gate electrode of the second transistor in the latch means will continue to pull up to the high state the control gate electrode of the control transistor device, thereby acting as a latch without drawing significant power because the programmable nonvolatile storage means does not conduct in this state. If the storage means has not been programmed (i.e., the floating gate has not been charged in the preferred embodiment), then during the "interrogation" of the storage means, the control gate electrode of the control transistor device will be pulled to a low state, as will the control gate electrode of the other transistor device in the latch means. Once the power up pulse disappears, the signal on the control gate electrode of the control transistor device will remain low as the storage means will continue to pull that node low while the latch means, coupled in series with the storage means, is off and hence prevents significant power from being drawn through the storage means.

BRIEF DESCRIPTION OF THE DRAWINGS

FIG. 1 shows a preferred embodiment for the power reduction circuitry of the present invention as implemented in a programmable logic device.

FIG. 2 shows schematically a sense amplifier circuit which may be used with the power reduction circuit of the present invention.

FIG. 3 shows an example of a well known single shot, rising edge pulse generator.

DETAILED DESCRIPTION OF THE INVENTION

This invention and certain embodiments thereof, will be described with reference to particular circuits, voltages and signals and other specific details of the invention where necessary for a thorough understanding of the invention. Other well known details which are not necessary to an understanding of the invention will be described in block diagram form in order not to unnecessarily obscure the invention. It will be understood by those skilled in the art that the invention may be practiced without the specific details disclosed herein. It will also be understood that the figures are for purposes of illustration.

An embodiment of the present invention showing the power reduction circuit is illustrated in FIG. 1. It should be understood that certain components shown in FIG. 1 are normally found in typical prior art PLDs; specifically, read product term 25 and the sense amplifier 104 for that read product term are conventional features of PLDs along with the EPROM cells, such as the EPROM cell 27, the control gate of which is coupled to the input term 26. The EPROM cell 27 includes a field effect device which is often referred to as a "FAMOS" device—floating gate avalanche injection metal oxide semiconductor device—which serves as a nonvolatile programmable storage means. It will be understood that EPROM 27 with input term 26 and product term 25 form a single EPROM cell. These specific features which are well known in the prior art are also shown in FIG. 2 (where the power reduction circuit has been omitted). The operation and construction of these PLD devices is well known in the art and will not therefore be described in detail herein.

The power reduction circuit, as shown in FIG. 1, includes three main components, which are the MOS field effect transistors 10 and 11 and the EPROMs 17 and 18 and the control transistor device 37. The EPROMs 17 and 18 in the particular embodiment shown in FIG. 1 form the nonvolatile programmable storage means which is used to store the information to indicate whether or not the sense amplifier 104 is to be powered up or powered down in the normal operation of the PLD. It will be appreciated that a single EPROM may be utilized rather than the two EPROMs 17 and 18 which are shown in FIG. 1 (in that case the EMPROM 18 is not used and is removed from the circuit leaving EPROM 17). The structure and operation of one EPROM and two EPROM cells is well known in the art; see, for example patents referred to above and also U.S. Pat. No. 4,851,720, filed Dec. 8, 1987 (entitled "Fast EPROM Programmable Logic Array Cell") assigned to the assignee of the instant invention.

The nonvolatile programmable storage means of the power reduction circuit shown in FIG. 1 is a dual EPROM cell containing the EPROMs 17 and 18 which share a floating gate 19. The source terminal of EPROM 18 is coupled to a reference voltage $V_{ss}$, which is typically ground, and the drain of EPROM 18 is coupled to the program product term (PPT) 21, which is a conventional program product term which is utilized in the same manner as other program product terms are used in the prior art to program EPROMs in programmable logic arrays. EPROM 18 includes a control gate electrode which is coupled to the control gate electrode of EPROM 17 both of which are coupled to an EPROM input term at node 20, which is kept hi (e.g., $V_{cc}$) during the normal operation of the power reduction circuit and which is either kept at a super voltage (i.e., programming voltage) or low during programming of the EPROM cell depending upon whether the EPROM cell is to be programmed (floating gate charged) or not programmed. As is well known in the art, the EPROMs 17 and 18 are programmed by applying a super voltage (e.g., +12 volts) to Node 20 while applying another super voltage onto the PPT 21; this causes electrons to be drawn onto (and thereby charging) the floating gate 19 which is shared by the read EPROM device 17 and the write EPROM device 18. The current path of EPROM 17 includes a source terminal, which is coupled to the reference voltage $V_{ss}$ and a drain terminal which is coupled to the source terminals of MOS field effect transistors 15 and 40.

The nonvolatile programmable storage means works in conjunction with the latch means formed largely by MOS field effect transistors 10 and 11 which have current paths coupled in parallel, which current paths are coupled in series with the current path of the EPROM 17 and hence the current path of the nonvolatile programmable storage means. MOS field effect transistors 10 and 11 are n-channel field effect transistors having their drains coupled to a reference supply voltage $V_{cc}$ (in this case a power supply voltage which is typically +5 volts). In the embodiment of the invention shown in FIG. 1, the high logic state will be about $V_{cc}$ and the low logic state will be about $V_{ss}$. The sources of MOS field effect transistors 10 and 11 are coupled to the drain of MOSFET (MOS field effect transistor) 12. As shown in FIG. 1, MOSFETs 12 and 15 are coupled in series between the latch means formed by MOSFETs 10 and 11 and the EPROM 17. The drain of MOSFET 15 is coupled to the source of MOSFET 12 at Node B.

The control gate electrode of MOSFET 10 is coupled at Node F to receive a power-up signal which is momentarily pulsed when power is first supplied to the power reduction circuit (and hence to the PLD chip). This power-up signal is typically provided by a rising edge, single shot pulse generator, such as that shown in FIG. 3. The power supply pin to the PLD chip (shown as $V_{cc}$) is coupled to the input of the rising edge single shot pulse generator and the output of that generator is coupled to Node F to produce a short, momentary pulse which quickly rises after power is initially supplied and then quickly falls back to $V_{ss}$; the length of the pulse is determined by the number of inverters coupled in series between $V_{cc}$ and the input "a" to the NAND gate 135. Inverters 130, 131 and 132 are shown in FIG. 3 and additional pairs of inverters may be added. As long as the total number of inverters is odd, more inverters may be added to increase the length of the pulse in order to permit the power reduction circuit shown in FIG. 1 to come to a stable state after powering up the PLD chip and the power reduction circuit.

The MOSFET 11 has a control gate electrode which is coupled through inverter 33 and NAND gate 30 to Node B and through MOSFET 15 to the drain terminal of the EPROM 17. The control gate electrode of MOSFET 11 serves as a feedback mechanism to keep Node B latched to the same state as Node E (i.e., the state of the control gate electrode for MOSFET 11) when the power reduction circuit has been set so that it causes the sense amplifier 104 to be powered down (i.e., power is not provided to sense amplifier 104). Node G is coupled to receive a signal which is maintained in the hi state during normal operation of the PLD and is kept in the low state during the programming mode of the PLD (when programming the EPROM cells in the array or in the storage means of the power reduction circuit). Node H receives a reference voltage which is similar to the reference voltage produced by reference voltage generator 103 shown in FIG. 4 of U.S. Pat. No. 4,851,720, filed Sept. 2, 1988 (entitled: "Low Power Sense Amplifier for Programmable Logic Device"), which is assigned to the assignee of the instant invention. While the sense amplifier 104 as shown in FIG. 1 of this invention may be any conventional, well known sense amplifier (particularly those used for PLD chips), FIG. 2 of this invention (in block 104 thereof) shows the same sense amplifier shown and described in U.S. Pat. No. 4,851,720, filed Sept. 2, 1988, which is incorporated by reference.

The control transistor device 37 is a p-channel MOS field effect transistor having its source coupled to the reference supply voltage $V_{cc}$ and its drain coupled to Node A such that the current path formed by the source and drain terminals of the control transistor device may selectively provide power to the sense amplifier 104 which is connected at Node A as shown in FIG. 1 and 2. The control gate electrode of the transistor device 37 is coupled at Node D to the output of inverter 32, the input of which is coupled at Node C to the output of the CMOS NAND logic gate 30 and to the input of the CMOS inverter 33. Thus, the control gate electrode of the control transistor device 37 is coupled, through inverter 32 and NAND 30 and MOSFET 15 to the drain terminal of the EPROM 17 which functions as the nonvolatile programmable storage means. In an alternative embodiment, MOSFET 37 may be replaced by an n-channel MOSFET having its gate control electrode coupled directly to Node C (and inverter 32 is not used); in this embodiment, the source of this n-channel MOSFET is coupled to Node A and its drain is coupled to $V_{cc}$. It will also be appreciated that in another alternative embodiment, inverters 32 and 33 may be replaced by a single inverter having its input coupled to Node C and its output coupled to Nodes D and E.

The power reduction circuit as shown in FIG. 1 includes a feature which permits the testing of the operation of the circuit by applying a lo signal at Node I and also includes the ability to allow the reading of the information stored in the nonvolatile programmable storage means through MOSFET 40 by applying a hi signal at Node J which is the control gate electrode of MOSFET 40. Node I as shown in FIG. 1 is coupled to one of the two inputs of the CMOS NAND logic gate 30. By applying a lo signal at Node I, the output of the NAND gate 30 (which is coupled to Node C) becomes hi causing Node D to become low thereby turning on the control transistor device 37 to thereby power-up (i.e., provide power to) the sense amplifier 104. It can be seen that, regardless of the state of the nonvolatile programmable storage means, the sense amplifier 104 will always be powered up by applying a lo signal to Node I. This enables the testing of the operation of various components in the power reduction circuit and the testing of the sense amplifier 104 along with the EPROM cells (e.g., cell 27) coupled to product term 25. The test mode occurs whenever Node I is taken lo; during normal operation Node I is maintained in the high state.

The information stored in EPROM 17 may be read and verified through the product term 25 by applying a hi signal to Node J which causes MOSFET 40 to provide a low resistance connection between the drain of EPROM 17 and the product term 25 thereby allowing the data in EPROM 17 to be read by the sense amplifier 104. Node J is kept low during normal operation of the circuit and is only taken hi when it is desired to read the information as stored in the EPROM 17. Reading EPROM 17 by applying a hi signal to Node J will also require that a lo signal be applied to Node I to be sure that the sense amplifier 104 is turned on to permit reading of the data appearing on product term 25 from the EPROM 17.

Chart 1 appearing immediately below shows the various logic states of the nodes in FIG. 1 during the normal operation of the power reduction circuit shown in FIG. 1. It will be understood that "hi" means the high state and "lo" means the low state.

Chart 1

Logic States of Nodes in Normal Operation and Test Mode

| Node | Power Down Mode (EPROM off) | Power Up Mode (EPROM on) | Test Mode |
|---|---|---|---|
| A | lo | hi | hi |
| B | hi | lo | NA (does not matter) |
| C | lo | hi | hi |
| D | hi | lo | lo |
| E | hi | lo | lo |
| F | lo | lo | lo |
| G | hi | hi | hi |
| H | Ref. V | Ref. V | Ref. V |
| I | hi | hi | lo |
| J | lo | lo | *hi/lo |
| 20 | hi | hi | hi |

*Hi if want to read bit stored in EPROM 17; lo if want to read product term 25 rather than bit stored in EPROM 17. Node F is shown in this chart after the momentary power-up pulse is completed.

The operation in the "normal mode" of the power reduction circuit follows the programming of the EPROM 17 by applying, in the well known manner, a super voltage signal to node 20 (the input term) while applying a hi signal to the program product term 21. This will cause the floating gate 19 to become charged which will keep the EPROM 17 "off" (i.e., no significant current will flow through the current path of EPROM 17). If it is desired not to program/charge the floating gate then no super voltage is applied to the input term at node 20 during the programming mode.

The operation of the power reduction circuit in the power-down mode (i.e., power will not be supplied to the sense amplifier 104) will now be described. As noted above, the power-down mode is effected by programming EPROM 17 so that its floating gate is charged (and hence EPROM 17 will remain off). Following programming of the power reduction circuit, the circuit is turned on from a resting state causing a power-up signal (which is momentarily pulsed) to be supplied at Node F to the control gate electrode of MOSFET 10. During that short pulse the EPROM 17 will be "interrogated" and will cause Node B to be pulled hi (in this case within one threshold voltage of $V_{cc}$) by MOSFETs 10 and 12 while EPROM 17 is off (thereby preventing EPROM 17 from pulling Node B low). It can be seen that during the momentary pulse at Node F, the hi signal at Node B will propagate through the NAND gate 30 causing Node C to be pulled low which will then cause Node E to be pulled hi, thereby turning MOSFET 11 on (adding to the effect of the pull-up on Node B by MOSFET 10) which latches Node B hi after the momentary pulse at Node F disappears back to the ground state. That is, Node B remains "latched" hi after the pulse of the power up signal at Node F because MOSFET 11, with its Node E pulled hi, will continue to pull Node B high through MOSFETs 11 and 12. Node E stays hi because it is coupled, through NAND 30 and inverter 33, to Node B. It will be observed that even though Node E is maintained at hi by the feed back of Node B to Node E through Node E is maintained at hi by the feed back of Node B to Node E through NAND 30 and inverter 33, there is no significant current being drawn through MOSFET 10 (which is now off) and MOSFETs 11, 12 and 15 because EPROM 17 is off. Accordingly, significant current and power is consumed by the power reduction circuit only during the momentary pulse which is applied at Node F and the latch mechanism described above perpetuates the selective powering down of the sense amplifier 104 without drawing significant current. This is particularly true when the NAND logic gate 30 and the inverters 32 and 33 are implemented in CMOS technology. It will be apparent that when Node B is hi, Node D is also hi causing the control transistor device 37 to be "off" thereby preventing power from being delivered through Node A to the sense amplifier 104.

The operation of the power reduction circuit shown in FIG. 1 will now be described when the circuit has been set to provide power to the sense amplifier 104 by not charging the floating gate of EPROM 17 during the programming mode of the power reduction circuit which allows the EPROM 17 to be "on". Thus in this case, during the normal operation of the power reduction circuit, the EPROM 17 will be capable of drawing significant current through the current path of the EPROM 17. Normal operation of the power reduction circuit will begin upon powering up the power reduction circuit which causes a momentary pulse to appear at Node F. As before, the state of EPROM 17 will be "interrogated" during this momentary power-up phase. It can be seen that, because EPROM 17 is "on", Node B will be pulled low through the current path of EPROM 17 during the momentary pulse applied to Node F. It will be appreciated that, during the momentary power up signal, EPROM 17 must pull Node B low despite the effect of MOSFET 10 which attempts to pull Node B high. That is, MOSFET 10 must provide a "weak" pull up on Node B. Therefore, EPROM 17 when "on" during the power-up mode must provide a strong enough current to pull Node B low; it will be apparent to those skilled in the art that MOSFET 10 and EPROM 17 should be constructed (in the well known manner of controlling the sizes of the souce-drain width and length of the two devices) so that their resistances when "on" permit Node B to be pulled low by EPROM 17. When Node B is low, Node E is also low thereby keeping MOSFET 11 off which prevents Node B from being pulled hi during and after the momentary pulse at Node F disappears. After that momentary pulse at Node F disappears MOSFET 11 will remain off and EPROM 17 will continue to keep Node B low which continues to keep Node E low. It will be appreciated that because MOSFETs 10 and 11 are kept "off" during the normal operation of the power-up mode, no significant current is wasted through MOSFETs 10, 11, 12 and 15 and the EPROM 17 (which is in series with those MOSFETs). During the power-up mode while Node B is low, Node D is kept low thereby turning on the control transistor device 37 which provides power to the sense amplifier 104. After the power-up signal at Node F disappears, Node D remains lo (and therefore power is supplied to the sense amplifier 104) because Node B and Node E also remain lo (due to Node B being pulled low by EPROM 17).

It will be appreciated by those skilled in the art that numerous modifications may be made to the foregoing invention without departing from the spirit and scope of the claimed invention. For example, the role of the floating gate 19 of the EPROM 17 may be reversed in that the floating gate is charged when it is desired to power-up the sense amplifier 104. Other modifications may include the use of a single EPROM rather than the two EPROMs 17 and 18 to store the information for the power reduction circuit. Moreover, MOSFET 40 may be removed from the circuit if it is not necessary to verify or read the information stored in the nonvolatile programmable storage means. Other modifications will be apparent to those skilled in the art.

We claim:

1. A circuit for the reduction of power consumption of unused circuitry by selectively powering down said unused circuitry, said circuit comprising:
a nonvolatile programmable storage means having a first current path between a first terminal and a second terminal, said second terminal being coupled to a first reference voltage;
a latch means being coupled to said nonvolatile programmable storage means, said latch means having a first control electrode being coupled to receive a power-up signal which is momentarily pulsed when power is first supplied to said circuit, said latch means having a second control electrode coupled to said first terminal of said first current path, said latch means having one of two stable states upon receiving said power-up signal, said one of two stable states of said latch means being determined by the state of said nonvolatible storage means;
a control transistor device having a third control electrode coupled to said latch means to receive a signal corresponding to said one of two stable states, said control transistor device having a current path coupled between a power supply and said unused circuitry to provide said power supply to said unused circuitry in response to a signal on said third control electrode.

2. A circuit as in claim 1 wherein said nonvolatile programmable storage means is a floating gate EPROM and wherein when said floating gate is charged, said control transistor device does not provide power to said unused circuitry.

3. A circuit as in claim 2 wherein said unused circuitry comprises a sense amplifier for a product term of a programmable logic array.

4. A power reduction circuit for the reduction of power consumption by selectively powering down unused circuitry, said power reduction circuit comprising:
a nonvolatile programmable storage means having a first current path formed between a first terminal and a second terminal of said storage means, said second terminal being coupled to a first reference voltage;
a latch means comprising a first and a second transistor having second and third current paths being coupled in parallel between a second reference voltage and said first terminal of said first current path, said first transistor having a first control electrode being coupled to receive a power-up signal which is momentarily pulsed when power is first supplied to said power reduction circuit, said second transistor having a second control electrode being coupled to said first terminal of said first current path;
a control transistor device having a third control electrode coupled to said first terminal of said first current path, said control transistor device having a fourth current path being coupled between a power supply and said unused circuitry to provide said power supply to said unused circuitry in response to a signal on said third control electrode, said second control electrode having one of two stable signal states after said power-up signal is momentarily pulsed, said one of two stable signal states being determined by the state of said nonvolatile programmable storage means.

5. A power reduction circuit as in claim 4 wherein said nonvolatile programmable storage means is a floating gate EPROM and wherein when said floating gate is charged, said control transistor device does not provide power to said unused circuitry.

6. A power reduction circuit as in claim 5 wherein said unused circuitry comprises a sense amplifier for a product term of a programmable logic array.

7. A power reduction circuit as in claim 6 wherein said third control electrode is coupled to said first terminal of said first current path through a logic gate and a first inverter and wherein said second control electrode is coupled to said first terminal of said first current path through said logic gate and a second inverter, and further comprising a means for providing power to said unused circuitry regardless of the state of said nonvolatile programmable storage device, said means for providing power comprising said logic gate having a first and a second input and an output, said first input of said logic gate being coupled to said first terminal of said first current path and said second input of said logic gate being coupled to receive a signal causing said means for providing power to provide power to said unused circuitry, said output of said logic gate being coupled to the input of said first inverter, the output of said first inverter being coupled to said third control electrode, said output of said logic gate being coupled to the input of said second inverter and the output of said second inverter being coupled to said second control electrode.

8. A power reduction circuit as in claim 7 wherein said logic gate is a CMOS NAND gate and said first and said second inverters are CMOS inverters.

9. A CMOS power reduction circuit for the reduction of power consumption of a sense amplifier for an unused product term of a programmable logic array, said CMOS power reduction circuit comprising:
a nonvolatile programmable storage means having a first current path between a first terminal and a second terminal, said second terminal being coupled to a first reference voltage, said nonvolatile programmable storage means having a floating gate to store charges, said floating gate having one of two possible states being charged and uncharged;
a first and a second MOS field effect transistor, said first MOS field effect transistor having a first control electrode coupled to receive a power-up signal which is momentarily pulsed when power is first supplied to said CMOS power reduction circuit, said first MOS filed effect transistor having a second current path, said second MOS filed effect transistor having a second control electrode and a third current path, said second current path and said third current path being coupled in parallel between a second reference voltage and a third terminal;

a third MOS field effect transistor having a third control electrode coupled to receive a third reference voltage and having a fourth current path having a one end and an other end, said one end of said fourth current path being coupled to said third terminal and said other end of said fourth current path coupled to said first terminal of said nonvolatile programmable storage means;

a logic gate having a first and a second input and a first output, said first input being coupled to said third terminal and said second input being coupled to receive a signal causing power to be provided to said sense amplifier regardless of the state of said floating gate;

a first inverter and a second inverter, said first inverter having a third input and a second output, said second inverter having a fourth input and a third output, said third input and said fourth input being coupled to said first output of said logic gate, said third output being coupled to said second control electrode;

a control transistor device having a fourth control electrode coupled to said second output of said first inverter and having a fifth current path being coupled between a power supply and said sense amplifier to selectively provide said power supply to said sense amplifier in response to a signal on said fourth control electrode, said signal on said fourth control electrode having one of two stable signal states after said power-up signal is momentarily pulsed being determined by the state of said floating gate.

10. A CMOS power reduction circuit as in claim 9 wherein said first and second inverters are CMOS inverters and wherein said logic gate is a CMOS logic gate.

11. A CMOS power reduction circuit as in claim 10 wherein when said floating gate is charged, said fifth current path of said control transistor device does not provide significant current to said sense amplifier, thereby reducing the power consumed by said sense amplifier.

12. A CMOS power reduction circuit as in claim 10 wherein when said floating gate is uncharged, said fifth current path of said control transistor device does not provide significant current to said sense amplifier, thereby reducing the power consumed by said sense amplifier.

13. A CMOS power reduction circuit as in claim 11 wherein said logic gate is a CMOS NAND gate.

14. A CMOS power reduction circuit as in claim 13 wherein said power supply that is coupled to said control transistor device is said second reference voltage and wherein said first reference voltage is ground.

15. A CMOS power reduction circuit as in claim 14 wherein said powerup signal, which momentarily pulsed when power is first supplied, is provided by a rising edge single shot pulse generator having an input and an output, said input being coupled to said second reference voltage and said output being coupled to said first control electrode.

16. A CMOS power reduction circuit as in claim 11 further comprising a fourth MOS field effect transistor having a fifth control electrode and having a sixth current path coupled between said product term and said first terminal of said nonvolatile programmable storage means to permit the state of the floating gate to be read through said product term when a signal is applied to said fifth control electrode.

17. A CMOS power reduction circuit as in claim 16 further comprising a fifth MOS field effect transistor having a seventh current path and having a sixth control electrode, said second and third current paths being coupled to said third terminal through said seventh current path, said sixth control electrode being coupled to a fourth reference voltage.

18. A CMOS power reduction circuit as in claim 17 wherein said control transistor device is a p-channel MOS field effect transistor.

* * * * *